United States Patent
Wu et al.

(10) Patent No.: US 11,498,451 B2
(45) Date of Patent: Nov. 15, 2022

(54) THERMAL MANAGEMENT METHOD FOR BATTERY PACK

(71) Applicant: Contemporary Amperex Technology Co., Limited, Ningde (CN)

(72) Inventors: Xingyuan Wu, Ningde (CN); Yanru Li, Ningde (CN); Yurui Song, Ningde (CN)

(73) Assignee: Contemporary Amperex Technology Co., Limited, Ningde (CN)

( * ) Notice: Subject to any disclaimer, the term of this patent is extended or adjusted under 35 U.S.C. 154(b) by 0 days.

(21) Appl. No.: 17/585,581

(22) Filed: Jan. 27, 2022

(65) Prior Publication Data

US 2022/0203863 A1    Jun. 30, 2022

Related U.S. Application Data

(63) Continuation of application No. PCT/CN2020/103845, filed on Jul. 23, 2020.

(30) Foreign Application Priority Data

Aug. 5, 2019  (CN) .......................... 201910716195.2

(51) Int. Cl.
*B60L 58/12* (2019.01)
*H01M 10/625* (2014.01)
(Continued)

(52) U.S. Cl.
CPC ............... *B60L 58/12* (2019.02); *B60L 58/26* (2019.02); *B60L 58/27* (2019.02); *G01R 31/3648* (2013.01); *H01M 10/625* (2015.04)

(58) Field of Classification Search
CPC .......... B60L 58/12; B60L 58/24; B60L 58/26; B60L 58/27; B60L 58/32; B60L 58/33;
(Continued)

(56) References Cited

U.S. PATENT DOCUMENTS

| | | | | |
|---|---|---|---|---|
| 2009/0143929 A1* | 6/2009 | Eberhard | ................ | H02J 7/045 903/907 |
| 2011/0118919 A1* | 5/2011 | Park | ........................ | B60L 58/26 701/22 |

(Continued)

FOREIGN PATENT DOCUMENTS

| | | |
|---|---|---|
| CN | 203766543 U | 8/2014 |
| CN | 104934653 A | 9/2015 |

(Continued)

OTHER PUBLICATIONS

The extended European search report for EP Application No. 20850104.9, dated May 9, 2022, 9 pages.

(Continued)

*Primary Examiner* — Paul Dinh
(74) *Attorney, Agent, or Firm* — East IP P.C.

(57) ABSTRACT

The present application discloses a thermal management method for a battery pack. The method includes: under a condition that an electric vehicle is in a stationary state, obtaining a power-on time of the battery pack in the electric vehicle; under a condition of determining that the battery pack has a thermal management demand, determining a target temperature of the battery pack according to a connection state of a charging interface of the electric vehicle and a charging device; determining a thermal management starting time of the battery pack based on the target temperature of the battery pack and the power-on time; and under a condition that the thermal management starting time arrives, performing thermal management on the battery pack so that a temperature of the battery pack reaches the target temperature before the power-on time arrives.

18 Claims, 7 Drawing Sheets

(51) Int. Cl.
*B60L 58/27* (2019.01)
*B60L 58/26* (2019.01)
*G01R 31/36* (2020.01)

(58) Field of Classification Search
CPC ... B60L 58/34; G01R 31/3648; H01M 10/625
USPC .......................................................... 701/22
See application file for complete search history.

(56) References Cited

U.S. PATENT DOCUMENTS

| | | | |
|---|---|---|---|
| 2013/0166119 A1* | 6/2013 | Kummer ............. | H01M 10/625 701/22 |
| 2014/0012447 A1* | 1/2014 | Gao ......................... | B60L 3/04 701/22 |
| 2014/0174707 A1 | 6/2014 | Lombardo et al. | |
| 2015/0266392 A1 | 9/2015 | Arai et al. | |
| 2016/0207417 A1 | 7/2016 | Gauthier et al. | |
| 2016/0214495 A1 | 7/2016 | Murata et al. | |
| 2017/0088007 A1 | 3/2017 | Melendez et al. | |

FOREIGN PATENT DOCUMENTS

| | | | |
|---|---|---|---|
| CN | 103887578 | B | 3/2016 |
| CN | 205376690 | U | 7/2016 |
| CN | 107672465 | A | 2/2018 |
| CN | 107972499 | A | 5/2018 |
| CN | 108501675 | A | 9/2018 |
| CN | 108501745 | A | 9/2018 |
| CN | 106183789 | B | 11/2018 |
| CN | 108790673 | A | 11/2018 |
| CN | 108987850 | A | 12/2018 |
| CN | 108987852 | A | 12/2018 |
| CN | 109037831 | A | 12/2018 |
| CN | 109068550 | A | 12/2018 |
| CN | 208232842 | U | 12/2018 |
| CN | 110015201 | A | 7/2019 |
| WO | 2019002193 | A1 | 1/2019 |

OTHER PUBLICATIONS

The First Office Action for China Application No. 201910716195.2, dated Oct. 19, 2021, 10 pages.
The International search report for PCT Application No. PCT/CN2020/103845, dated Oct. 28, 2020, 11 pages.
The Second Office Action for China Application No. 201910716195.2, dated Dec. 16, 2021, 8 pages.
The First Office Action for EP Application No. 20850104.9, dated Sep. 28, 2022, 7 pages.

* cited by examiner

THERMAL MANAGEMENT METHOD FOR BATTERY PACK

CROSS-REFERENCE TO RELATED APPLICATION

This application is a continuation of International Application No. PCT/CN2020/103845, filed on Jul. 23, 2020, which claims priority to Chinese Patent Application No. 201910716195.2 entitled "Thermal Management Method for Battery Pack" and filed on Aug. 5, 2019, both of which are incorporated herein by reference in their entireties.

TECHNICAL FIELD

This application relates to the field of new energy, and in particular to a thermal management method for a battery pack.

BACKGROUND

Only when a temperature of a battery pack in an electric vehicle is within a suitable temperature range, the electric vehicle can operate normally, so thermal management is required for the battery pack.

In winter, the passenger compartment of the electric vehicle has a relatively great demand for heating, while in summer, the passenger compartment's demand for cooling consumes a lot of power, which will greatly reduce the driving mileage of the electric vehicle. When the battery pack itself has a thermal management demand, if the thermal management is performed using the power of the power pack, the power consumption of the battery pack will be further increased.

Therefore, an intelligent thermal management method for the battery pack is needed to reduce the power consumption of the battery pack, thereby increasing the driving mileage of the battery pack.

SUMMARY

The present application provides a thermal management method for a battery pack.

According to embodiments of the present application, a thermal management method for a battery pack includes:
under a condition that an electric vehicle is in a stationary state, obtaining a power-on time of the battery pack in the electric vehicle;
under a condition of determining that the battery pack has a thermal management demand, determining a target temperature of the battery pack according to a connection state of a charging interface of the electric vehicle and a charging device;
determining a thermal management starting time of the battery pack based on the target temperature of the battery pack and the power-on time; and
under a condition that the thermal management starting time arrives, performing thermal management on the battery pack so that a temperature of the battery pack reaches the target temperature before the power-on time arrives.

DESCRIPTION OF THE DRAWINGS

In order to explain the technical solutions of the embodiments of the present application more clearly, the following will briefly introduce the drawings that need to be used in the embodiments of the present application. A person of ordinary skill in the art can obtain other drawings based on these drawings without inventive effort.

DETAILED DESCRIPTION

The features and exemplary embodiments of various aspects of the present application will be described in detail below. In order to make the objectives, technical solutions, and advantages of the present application clearer, the present application will be further described in detail below with reference to the drawings and embodiments. It should be understood that the specific embodiments described herein are merely used to explain the present application, rather than to limit the present application. For those skilled in the art, the present application can be implemented without some of these specific details. The following description of the embodiments is merely to provide a better understanding of the present invention by illustrating examples of the present invention.

It should be noted that, in the present application, relational terms, such as first and second, are used merely to distinguish one entity or operation from another entity or operation, without necessarily requiring or implying any actual such relationships or orders of these entities or operations. Moreover, the terms "comprise", "include", or any other variants thereof, are intended to represent a non-exclusive inclusion, such that a process, method, article or device including a series of elements includes not only those elements, but also other elements that are not explicitly listed or elements inherent to such a process, method, article or device. Without more constraints, the elements following an expression "comprise/include . . . " do not exclude the existence of additional identical elements in the process, method, article or device that includes the elements.

Figure 1:
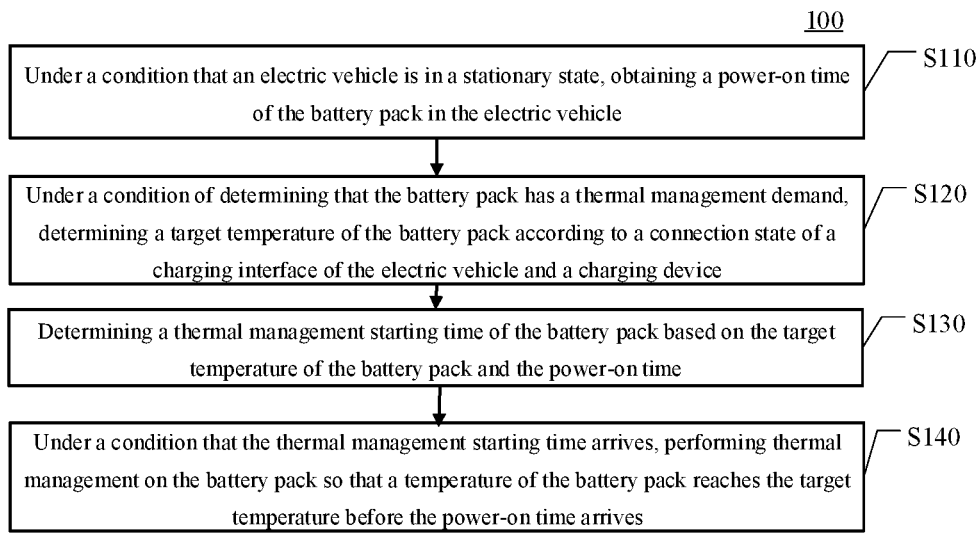
FIG. 1 is a schematic flowchart of a first embodiment of a thermal management method for a battery pack provided according to the present application.

FIG. 1 shows a schematic flowchart of a thermal management method 100 for a battery pack provided according to the present application. As shown in FIG. 1, the thermal management method for a battery pack provided according to the present application includes the following steps:

S110, under a condition that an electric vehicle is in a stationary state, obtaining a power-on time of the battery pack in the electric vehicle;

S120, under a condition of determining that the battery pack has a thermal management demand, determining a target temperature of the battery pack according to a connection state of a charging interface of the electric vehicle and a charging device;

S130, determining a thermal management starting time of the battery pack based on the target temperature of the battery pack and the power-on time; and S140, under a condition that the thermal management starting time arrives, performing thermal management on the battery pack so that a temperature of the battery pack reaches the target temperature before the power-on time arrives.

As an example, the power-on time of the battery pack is a starting time of the electric vehicle, that is, a travel time of a user.

The thermal management method for the battery pack provided according to the present application can be applied to a battery management system (Battery Management System, BMS) of the battery pack.

In the embodiment of the present application, the target temperature of the battery pack is determined according to the connection state of the charging interface of the electric vehicle and the charging device, and if the charging interface is connected with the charging device, the battery pack can be heated by the charging device, so the target temperature of the battery pack can be set to be slightly higher. If the charging interface is not connected with the charging device, the target temperature of the battery pack can be set to be slightly lower, to avoid or reduce the power consumption of the battery pack as much as possible so as to increase the driving mileage of the battery pack. In addition, by determining the thermal management starting time based on the power-on time of the electric vehicle and the target temperature of the battery pack, the battery pack can be pre-heated or pre-cooled at a best time, which also avoids the power consumption of the battery pack and increases the driving mileage of the battery pack.

Figure 2:
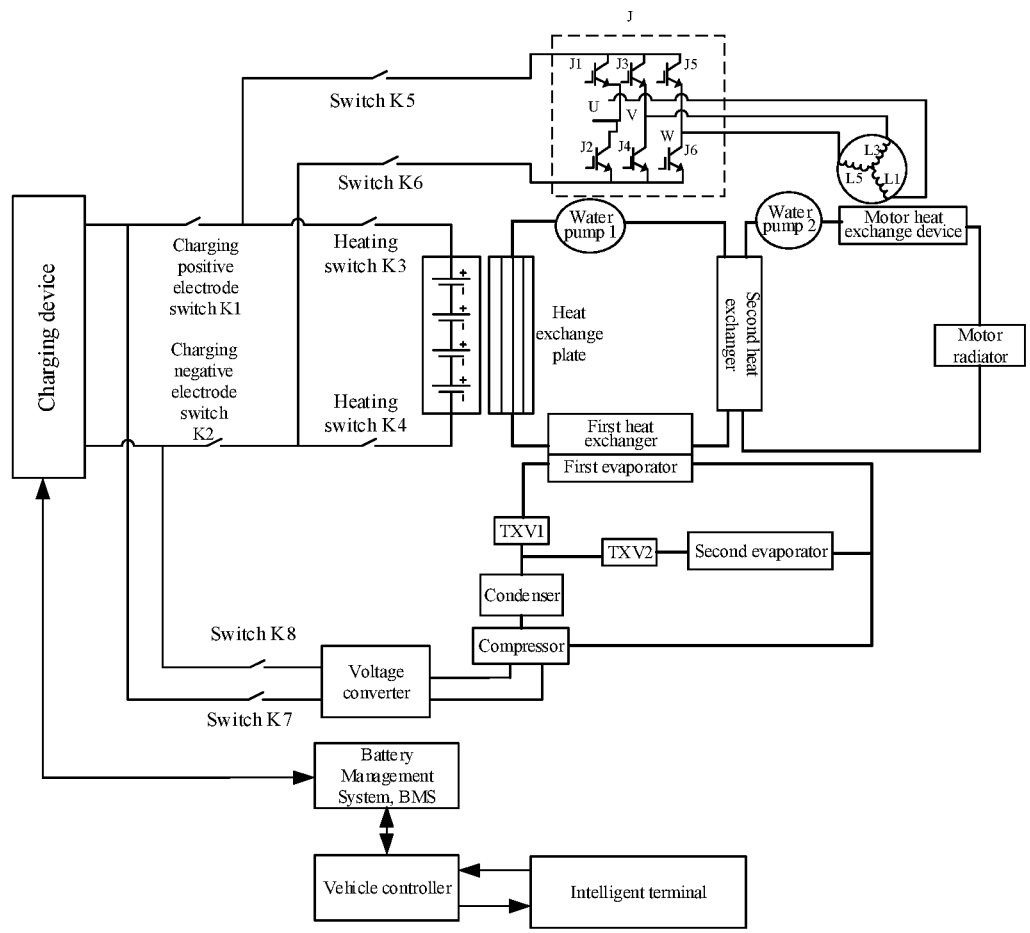
FIG. 2 is a schematic structural diagram of an embodiment of a thermal management system for a battery pack provided according to the present application.

In the embodiments of the present application, referring to a thermal management system diagram of an electric vehicle shown in FIG. 2, the thermal management system of the electric vehicle includes a vehicle controller and a BMS. The double-headed arrow between the vehicle controller and the BMS represents that they can communicate in both directions.

In the embodiments of the present application, in step S110, the BMS can obtain the power-on time of the battery pack from the vehicle controller.

Figure 3:
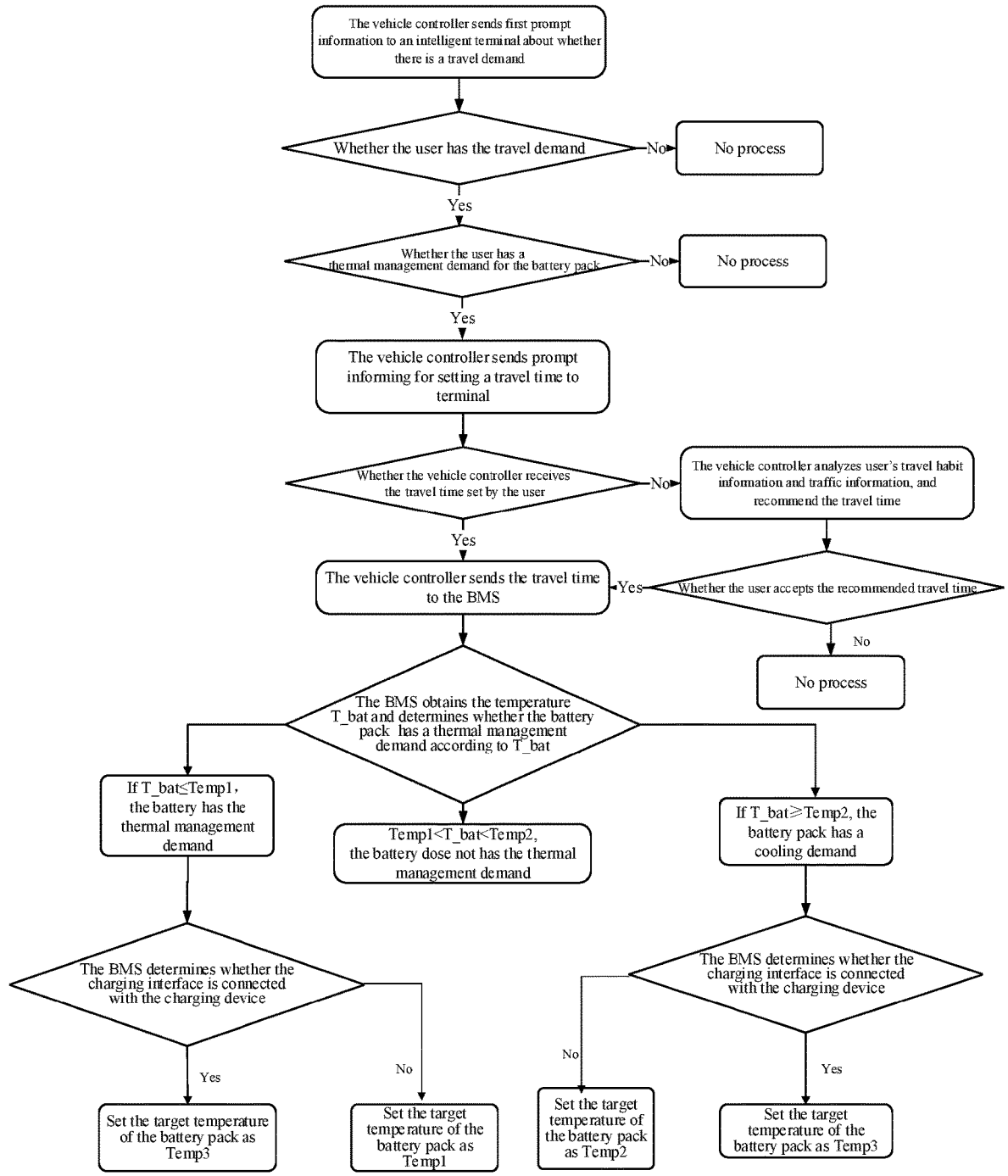
FIG. 3 is a schematic flowchart of a second embodiment of a thermal management method for a battery pack provided according to the present application.

As an example, referring to FIG. 3, in step S110, when the vehicle controller detects that the electric vehicle stops running, that is, when the electric vehicle is in a stationary state, the BMS controls the vehicle controller to send first prompt information to an intelligent terminal about whether there is a travel demand. Under a condition that the vehicle controller receives feedback information sent by the intelligent terminal that the user does not have the travel demand, the BMS does not operate.

Under a condition that the vehicle controller receives feedback information sent by the intelligent terminal that the user has the travel demand, the BMS controls the vehicle controller to send second prompt information to the intelligent terminal about whether there is a thermal management demand for the battery pack.

Under a condition that the vehicle controller receives feedback information sent by the intelligent terminal that the user does not have the thermal management demand for the battery pack, the BMS does not operate.

Under a condition that the vehicle controller receives feedback information sent by the intelligent terminal that the user has the thermal management demand for the battery pack, the BMS controls the vehicle controller to send third prompt information for setting a travel time to the intelligent terminal. In FIG. 2, the double-headed arrow between the vehicle controller and the intelligent terminal represents that they can communicate in both directions.

The vehicle controller determines whether the user sets the travel time through the intelligent terminal. As an example, the vehicle controller can determine whether the user sets the travel time by whether it receives time information sent by the intelligent terminal within a preset time period $t_0$.

Under a condition that the vehicle controller receives the travel time set by the user returned by the intelligent terminal within the preset time period $t_0$, the vehicle controller sends the travel time set by the user to the BMS. The BMS uses the received travel time as the power-on time of the battery pack.

Referring to FIG. 3, under a condition that the vehicle controller does not receive the time information returned by the intelligent terminal within the preset time period $t_0$, the vehicle controller analyzes pre-recorded user's travel habit information and traffic information of each travel, and calculates a travel time recommended to the user. The vehicle controller sends the recommended travel time to the intelligent terminal. Under a condition that the user accepts the recommended travel time through the intelligent terminal, the vehicle controller uses the recommended travel time as the power-on time of the battery pack. Under a condition that the user does not accept the recommended travel time, either of the vehicle controller and the BMS does not operate.

Continuing to refer to FIG. 3, under a condition that the BMS obtains the power-on time of the battery pack from the vehicle controller, the BMS determines whether the battery pack has a thermal management demand. As an example, in step S120, the BMS may determine whether the battery pack has a thermal management demand according to a temperature of the battery pack.

In some embodiments of the present application, in S120, the BMS firstly obtains a temperature T_bat of the battery pack, and then determines whether the battery pack has a thermal management demand according to the temperature T_bat of the battery pack, a first preset temperature threshold and a second preset temperature threshold.

Herein, the first preset temperature threshold is determined based on a lowest operating temperature Temp1 of the battery pack, and the second preset temperature threshold is determined based on a highest operating temperature Temp2 of the battery pack. Temp1 is less than Temp2. As a specific example, the first preset temperature threshold is equal to the lowest operating temperature Temp1 of the battery pack, and the second preset temperature threshold is equal to the highest operating temperature Temp2 of the battery pack. The lowest operating temperature Temp1 of the battery pack refers to the lowest temperature of the battery pack under which the electric vehicle can operate normally. The highest temperature Temp2 of the battery pack refers to the highest temperature of the battery pack under which the electric vehicle can operate normally.

Continuing to refer to FIG. 3, under a condition that Temp11 T_bat Temp2, it is determined that the battery pack does not have the thermal management demand. Under a condition of determining that the battery pack does not have the thermal management demand, the BMS re-obtains the temperature of the battery pack every preset time interval $\Delta t_0$, and continues to determine whether the battery pack has the thermal management demand according to the re-obtained temperature of the battery pack, the Temp1 and the Temp2.

It should be noted that the thermal management demand of the battery pack includes a demand for cooling and a demand for heating. Under a condition of T_bat≤Temp1, the BMS determines that the battery pack has the demand for heating; and under a condition of T_bat≥Temp2, the BMS determines that the battery pack has the demand for cooling.

In the embodiments of the present application, in step S120, when determining that the battery pack has the thermal management demand, the BMS determines the target temperature of the battery pack according to the connection state of the charging interface of the electric vehicle and the charging device. As an example, the charging device may be a charging pile.

Continuing to refer to FIG. 3, when determining that the battery pack has the thermal management demand, regardless of the demand for heating or the demand for cooling, the BMS determines whether the charging interface of the electric vehicle is connected with the charging device.

As an example, the BMS may determine whether the charging interface of the electric vehicle is connected with the charging device by determining whether it receives a wake-up signal sent by the charging device to indicate that the charging device itself has established a connection with the charging interface of the electric vehicle. Under a condition that the BMS receives the wake-up signal sent by the charging device, the BMS determines that the charging device is connected with the charging interface of the electric vehicle. Under a condition that the BMS does not receive the wake-up signal sent by the charging device, the BMS determines that the charging device is not connected with the charging interface of the electric vehicle.

In step S120, under a condition that the battery pack has the thermal management demand (regardless of a demand for heating or a demand for cooling) and the charging interface of the electric vehicle is connected with the charging device, the target temperature is set as a third preset temperature threshold.

Under a condition that the thermal management demand of the battery pack is a demand for heating and the charging interface of the electric vehicle is not connected with the charging device, the target temperature is set as a fourth preset temperature threshold.

Under a condition that the thermal management demand of the battery pack is a demand for cooling and the charging interface of the electric vehicle is not connected with the charging device, the target temperature is set as a fifth preset temperature threshold.

Herein, the fourth preset temperature threshold is less than the third preset temperature threshold, and the third preset temperature threshold is less than the fifth preset temperature threshold.

As an example, the third preset temperature threshold is an optimal operating temperature Temp3 of the battery pack, the fourth preset temperature threshold is equal to the lowest operating temperature Temp1 of the battery pack, and the fifth preset temperature threshold is equal to the highest operating temperature Temp2 of the battery pack.

Continuing to refer to FIG. 3, if the battery pack has the thermal management demand, regardless of the demand for heating or the demand for cooling, as long as the charging interface of the electric vehicle is connected with the charging device, the thermal management can be performed on the battery pack by virtue of the charging device to avoid power consumption of the battery pack, so the target temperature of the battery pack can be set as the optimal operating temperature Temp3 of the battery pack.

If the battery pack has the demand for heating, but the charging interface of the electric vehicle is not connected with the charging device, the power of the battery pack itself may be needed to perform the thermal management on the battery pack. In order to increase the driving mileage of the electric vehicle as far as possible, the target temperature of the battery pack is heated to the lowest operating temperature so that the electric vehicle can be started and operate.

If the battery pack has the demand for cooling, but the charging interface of the electric vehicle is not connected with the charging device, in order to increase the driving mileage of the electric vehicle as far as possible, the target temperature of the battery pack is decreased to the highest operating temperature of the battery pack so that the electric vehicle can be started and operate.

In the embodiments of the present application, when the battery pack has the thermal management demand, the target temperature of the battery pack is intelligently and reasonably set according to the connection state of the charging interface of the electric vehicle and the charging device, to avoid power consumption of the battery pack as much as possible so as to increase the driving mileage of the battery pack.

In the embodiments of the present application, the type of the thermal management demand of the battery pack and the connection state of the charging interface of the electric vehicle with the charging device not only affect the setting of the target temperature of the battery pack, but also affect the calculation of the thermal management starting time. The following will introduce the calculation process of the thermal management starting time according to different scenarios.

Scenario 1: the battery pack has the demand for heating, and the charging interface of the electric vehicle is connected with the charging device.

In scenario 1, after the BMS determines that the charging interface of the electric vehicle is connected with the charging device, the BMS determines whether the charging device has a function of heating the battery pack.

After the charging device is connected with the charging interface of the electric vehicle, the charging device will automatically reports its performance information to the BMS. The BMS may determine whether the charging device has a heating function according to heating identification information in the performance information reported by the charging device. The performance information reported by the charging device may further include information such as power information, charging device model, and charging current type.

The heating identification information reported by the charging device may indicate whether the charging device has the heating function, so the BMS may determine whether the charging device has the heating function based on the received heating identification information of the charging device.

Figure 4:
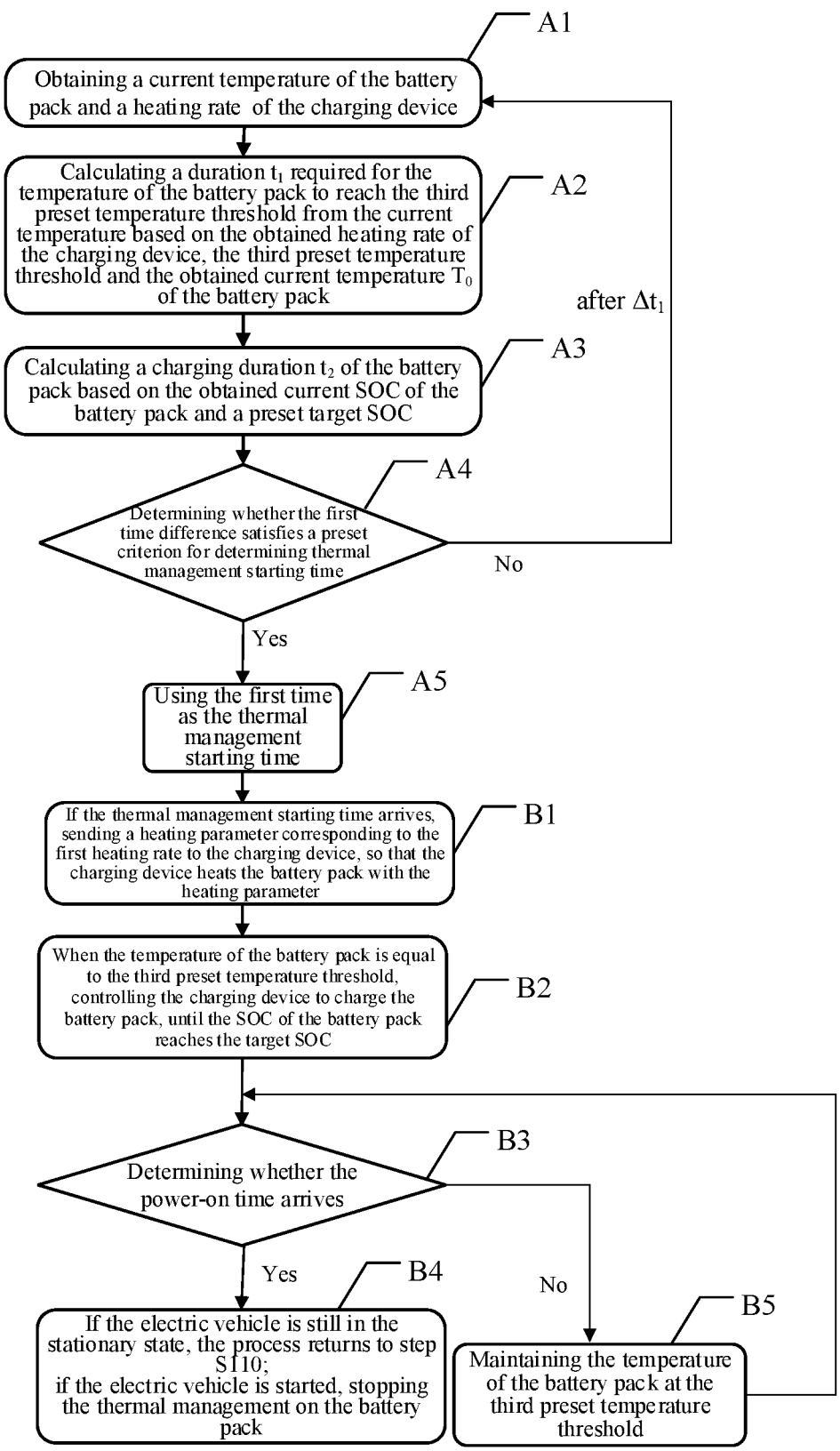
FIG. 4 is a schematic flowchart of a third embodiment of a thermal management method for a battery pack provided according to the present application.

(1) Under a condition that the BMS determines that the charging device has the heating function, referring to FIG. 4, step S130 includes step A1 to step A5.

Step A1, the BMS obtains a current temperature of the battery pack and a heating rate (i.e., a first heating rate) of the charging device.

It should be noted that, when the state parameter (such as remaining power and current temperature of the battery pack) of the battery pack is different, the required heating rate is different. Therefore, the BMS may obtain the first heating rate according to an obtained current state parameter of the battery pack and a pre-stored corresponding relationship between the state parameter of the battery pack and the heating rate. In some other embodiments, the first heating rate may also be a heating rate preset by the BMS.

Step A2, the BMS calculates a duration $t_1$ required for the temperature of the battery pack to reach the third preset temperature threshold from the current temperature based on the obtained heating rate $v_1$ of the charging device, the third preset temperature threshold and the obtained current temperature $T_0$ of the battery pack.

During heating of the battery pack by the charging device, a heat conduction occurs between the battery pack and an external environment, so the influence of the heat conduction between the battery pack and the external environment on the calculation of $t_1$ also needs to be considered.

Therefore, in calculating the heating duration of the battery pack, an environmental temperature T_env of the electric vehicle needs to be obtained firstly.

It is worth mentioned that the BMS may directly obtain the environmental temperature of the electric vehicle from a temperature sensor that measures the environmental temperature of the electric vehicle. The BMS may also receive the environmental temperature of the electric vehicle from the vehicle controller, and the vehicle controller may obtain the environmental temperature of the electric vehicle from an environmental temperature sensor disposed on the vehicle.

As an example, the third preset temperature threshold is equal to the optimal operating temperature Temp3 of the battery pack, then $t_1$ may be calculated using the following equation:

$$t_1 = \frac{Temp3 - T_0}{v_1 \times \gamma_1} + \frac{Temp3 - T\_env}{v_2 \times \gamma_2} \quad (1)$$

where $v_2$ is a heat conduction rate obtained by the BMS, $\gamma_1$ is a preset first correction coefficient, and $\gamma_2$ is a preset second correction coefficient.

It should be noted that the BMS may determine the heat conduction rate $v_2$ according to a pre-stored corresponding relationship between a temperature range and the heat conduction rate, which will not be repeated herein.

Step A3, the BMS obtains a current state of charge (State of Charge, SOC) of the battery pack, and calculates a charging duration $t_2$ of the battery pack based on the current SOC of the battery pack and a preset target SOC of the battery pack.

Herein, the BMS may calculate the charging duration of the battery pack using any known charging time calculation method, which will not be repeated herein.

Step A4, the BMS obtains a current time, and determines whether a first time difference between a first time and the current time satisfies a preset criterion for determining thermal management starting time.

Herein, the first time is before the power-on time of the battery pack, and a duration between the first time and the power-on time is equal to $t_1+t_2$.

As an example, the power-on time is 14:00 on Jul. 19, 2019, $t_1$ is equal to 10 minutes, and $t_2$ is equal to 20 minutes, then the first time is 13:30 on Jul. 19, 2019.

Herein, the first time is an estimated thermal management starting time. Under a condition that the time difference between the estimated thermal management starting time and the current time satisfies the preset criterion for determining thermal management starting time, the first time is determined as a final thermal management starting time. Under a condition that the time difference between the estimated thermal management starting time and the current time does not satisfy the preset criterion for determining thermal management starting time, $t_1+t_2$ is re-calculated to re-estimate the thermal management starting time.

As an example, the preset criterion for determining thermal management starting time is that the first time difference is less than a preset duration threshold.

Under a condition that the first time difference satisfies the preset criterion for determining thermal management starting time, the process proceeds to step A5. Under a condition that the first time difference does not satisfy the preset criterion for determining thermal management starting time the process returns to step A1 after a second preset time interval $\Delta t_1$.

That is, under a condition that the first time difference does not satisfy the preset criterion for determining thermal management starting time, then after the second preset time interval $\Delta t_1$, the current temperature of the battery pack is updated, and $t_1$ and $t_2$ are updated based on the re-obtained current temperature of the battery pack, until the thermal management starting time of the battery pack is obtained.

Step A5, the first time is used as the thermal management starting time.

Referring to FIG. 2, the double-headed arrow between the charging device and the BMS represents that they can communicate in both directions. The charging device is connected with the charging interface of the electric vehicle (not shown in FIG. 2), the charging interface of the electric vehicle is connected with the positive electrode of the battery pack through a charging positive electrode switch K1 and a heating switch K3 connected in series, and the charging interface of the electric vehicle is further connected with the negative electrode of the battery pack through a charging negative electrode switch K2 and a heating switch K4 connected in series.

Referring to FIG. 4, step S140 includes step B1 to step B5.

Step B1, when the BMS determines that the thermal management starting time arrives, the BMS controls all of the charging positive electrode switch K1, the charging negative electrode switch K2, the heating switch K3 and the heating switch K4 to turn on, and sends a heating request including a heating parameter corresponding to the heating rate of the charging device to the charging device.

As an example, the charging device may have a pulse heating function. The BMS may determine a pulse current signal parameter corresponding to the heating rate of the charging device according to a pre-stored corresponding relationship between the pulse current signal parameter and the heating rate. The BMS may send the pulse current signal parameter corresponding to the heating rate of the charging device to the charging device, for example, the pulse current signal parameter includes parameters such as a frequency of the pulse current signal and a duty ratio of the pulse current signal.

Herein, the duty ratio of the pulse current signal refers to a ratio of the time during which the current direction is a positive direction to one cycle of the pulse current.

After the charging device receives the pulse current signal parameter for pulse heating of the battery pack, the charging device provides a pulse current having the above pulse current signal parameter.

Since all of the charging positive electrode switch K1, the charging negative electrode switch K2, the heating switch K3 and the heating switch K4 are turned on, the charging device and the battery pack constitute a pulse heating loop. When the pulse current flows through the battery pack, an internal resistor of the battery pack itself may generate heat, thereby heating the battery pack.

In the embodiments of the present application, the charging device may also heat the battery pack by other heating means, which is not limited herein.

Step B2, when the temperature of the battery pack is equal to the third preset temperature threshold, the charging device is controlled to charge the battery pack, until the SOC of the battery pack reaches the target SOC.

During heating of the battery pack by the charging device, the BMS monitors the temperature of the battery pack in real time, and under a condition that the temperature of the battery pack reaches the third preset temperature threshold, the thermal management on the battery pack is stopped. The BMS sends a charging request including a charging current to the charging device, and controls the charging device to charge the battery pack with this charging current, until the SOC of the battery pack reaches the preset target SOC.

Step B3, when the power of the battery pack reaches a preset target power, it is determined whether the power-on time arrives. Under a condition that the power-on time arrives, the process proceeds to step B4, and under a condition that the power-on time does not arrive, the process proceeds to step B5.

Step B4, under a condition that the electric vehicle is still in the stationary state, the process returns to step S110; and under a condition that the electric vehicle is started, the thermal management on the battery pack is stopped.

Under a condition that the power-on time arrives and the electric vehicle is still in the stationary state, it indicates that the user does not travel according to the set time, then the BMS controls the charging positive electrode switch K1 and the charging negative electrode switch K2 to turn off, and re-obtains the power-on time of the battery pack, that is, the process returns to step S110. Under a condition that the power-on time arrives and the electric vehicle is started, it indicates that the user travels on time, then the BMS controls the charging positive electrode switch K1 and the charging negative electrode switch K2 to turn off to stop performing the thermal management on the battery pack.

Step B5, the temperature of the battery pack is maintained at the third preset temperature threshold.

In order that the thermal management method for the battery pack provided in the embodiments of the present application is suitable for more thermal management application scenarios, under a condition that the power-on time does not arrive, the BMS monitors the temperature of the battery pack in real time. Under a condition that a temperature difference between the temperature of the battery pack and the third preset temperature threshold satisfies a preset thermal management starting criterion, the BMS sends a heating request to the charging device, to control the charging device to heat the battery pack, until the temperature of the battery pack reaches the target temperature. Under a condition that the temperature of the battery pack reaches the target temperature, the BMS controls the charging positive electrode switch K1 and the charging negative electrode switch K2 to turn off, to stop performing the thermal management on the battery pack so as to maintain the temperature of the battery pack at the target temperature. After the temperature of the battery pack reaches the third preset temperature threshold, the process returns to step B3, until the power-on time arrives under the third preset temperature threshold. Herein, the preset thermal management starting criterion is that a difference of the target temperature minus the temperature of the battery pack is greater than a preset temperature difference threshold.

(2) The BMS determines that the charging device does not have the heating function.

In the embodiments of the present application, under a condition that the charging device does not have the function of heating the battery pack, the battery pack may be heated using at least one of the following methods:

The battery pack is heated by a self-heating function of the battery pack, by waste heat generated by a motor in the electric vehicle, and by energy obtained by the motor from the charging device.

The following describes an implementation process of the self-heating function of the battery pack.

Referring to FIG. 2, the thermal management system for the battery pack further includes a switch K5 connected with the heating switch K3, a switch K6 connected with the heating switch K4, a switch drive component J connected between the switch K5 and the switch K6, a motor M connected with the switch drive component J, and a motor controller (not shown in FIG. 2). The switch drive component J and the motor controller are both located in an inverter.

Herein, the switch drive component J includes power switch devices J1 to J6, and each power switch device has a corresponding parasitic diode. The switch K5 and the switch K6 are connected with a battery management unit (Battery Management Unit, BMU) (not shown in FIG. 2). The power switch devices J1 to J6 are all connected with the motor controller (not shown in FIG. 2). The switch drive component J includes a first-phase arm, a second-phase arm and a third-phase arm connected in parallel. The first-phase arm, the second-phase arm and the third-phase arm each has an upper arm and a lower arm, each upper arm is provided with a power switch device, and each lower arm is also provided with a power switch device.

For example, as shown in FIG. 2, the first-phase arm is a U-phase arm, the second-phase arm is a V-phase arm, and the third-phase arm is a W-phase arm. Herein, the switch unit of the upper arm of the U-phase arm is the power switch device J1, and the lower arm of the U-phase arm is provided with the power switch device J2. The switch unit of the upper arm of the V-phase arm is the power switch device J3, and the switch unit of the lower arm of the V-phase arm is the power switch device J4. The switch unit of the upper arm of the W-phase arm is the power switch device J5, and the switch unit of the lower arm of the W-phase arm is the power switch device J6.

Referring to FIG. 2, the stator of the motor M is equivalent to three phases of stator inductors, that is, stator inductor L1, stator inductor L3, and stator inductor L5. Each phase of stator inductor is connected with a phase arm, and the stator inductor is capable of storing energy and releasing energy. Herein, one end of the stator inductor L1, one end of the stator inductor L3 and one end of the stator inductor L5 are connected to a common end.

A first-phase input end, a second-phase input end, and a third-phase input end of the motor M are respectively connected with a connection point of the upper arm and the lower arm of the first-phase arm, a connection point of the upper arm and the lower arm of the second-phase arm, and a connection point of the upper arm and the lower arm of the third-phase arm. A non-common end of the stator inductor L1 is the first-phase input end, a non-common end of the stator inductor L3 is the second-phase input end, and a non-common end of the stator inductor L5 is the third-phase input end.

When the BMU determines that the battery pack needs to be heated, the BMU sends a battery heating request to the vehicle controller. Under a condition of determining that the electric vehicle is in the stationary state and the motor is not operating, the vehicle controller sends a battery heating instruction to the motor controller according to the battery heating request. The motor controller establishes a communication with the BMU after receiving the battery heating instruction. Then, the BMU controls all of the heating switch K3, the heating switch K4, the switch K5 and the switch K6 to turn on, and controls the motor controller to provide drive signals for a power switch device of a target upper arm and a power switch device of a target lower arm, to control the power switch device of the target upper arm and the power switch device of the target lower arm to be periodically turned on and off.

Specifically, the drive signal may be a pulse signal. In some examples, a high level in the drive signal can drive the power switch device to be turned on, and a low level signal in the drive signal can drive the power switch device to be turned off. The drive signal may control the power switch device of the target upper arm and the power switch device of the target lower arm to be periodically turned on and off.

Herein, the power switch device of the target upper arm is the power switch device of the upper arm of any of the first-phase arm, the second-phase arm and the third-phase arm, and the power switch device of the target lower arm is the power switch device of the lower arm of at least one arm except the arm where the power switch device of the target upper arm is located.

The drive signal drives the power switch device of the target upper arm and the power switch device of the target lower arm to be periodically turned on and off, thus an alternating current is generated in the loop formed by the battery pack, the heating switch K3, the switch K5, the power switch device of the target upper arm, the motor M, the power switch device of the target lower arm, the switch K6, and the heating switch K4. Specifically, an alternating sinusoidal current may be generated. That is, the battery pack is charged and discharged alternately, which may generate a continuous alternating excitation current in a high-voltage loop where the battery pack is located, which flows continuously through the battery pack so that an internal resistor of the battery pack generates heat, which heats the battery from the inside.

The following describes a process of heating the battery pack by heat generated by a motor in the electric vehicle.

Referring to FIG. 2, the thermal management system of the electric vehicle further includes a thermal management system of the battery pack, a cooling system of the motor, and an air-conditioning system.

Herein, the thermal management system of the battery pack includes a water pump 1, a heat exchange plate and a first heat exchanger connected in series. The cooling system of the motor includes a motor radiator, a motor heat exchange device and a water pump 2 connected in series.

Herein, the cooling system of the motor is connected with the thermal management system of the battery pack by a second heat exchanger. A first port of the second heat exchanger is connected with the water pump 1, a second port of the second heat exchanger is connected with the water pump 2, a third port of the second heat exchanger is connected with the first heat exchanger, and a fourth port of the second heat exchanger is connected with the motor radiator.

When the motor generates heat, the BMU controls all of the water pump 2, the water pump 1 and the second heat exchanger to be in an on-state, and the motor heat exchange device absorbs the heat generated by the motor into a cooling liquid of the cooling system of the motor. When the cooling liquid after absorbing the heat in the cooling system of the motor flows through the second heat exchanger, the second heat exchanger transfers the heat in the cooling liquid in the cooling system of the motor to a cooling liquid in the battery management system.

When the cooling liquid after absorbing the heat in the battery management system flows through the heat exchange plate, the heat exchange plate transfers the heat to the battery pack so as to heat the battery pack using the waste heat generated by the motor.

It should be noted that the thermal management system of the electric vehicle further includes the air-conditioning system. The air-conditioning system includes a first evaporator, a compressor, a condenser and an expansion valve TXV1 connected in series. The air-conditioning system further includes an expansion valve TXV2 and a second evaporator connected in series. Herein, the second evaporator is connected with a common port of the first evaporator and the compressor, and the expansion valve TXV2 is connected with a common port of the expansion valve TXV1 and the condenser. The first evaporator is connected with the first heat exchanger and is used for absorbing heat transferred by the first heat exchanger to cool the battery pack.

When the battery pack has the demand for cooling, the BMU controls all of the expansion valve TXV1, the expansion valve TXV2 and the water pump 1 to be in an on-state, and controls the compressor to be in an on-state, then the heat generated by the battery pack is transferred to the cooling liquid in the thermal management system of the battery pack by the heat exchange plate. When the cooling liquid after absorbing the heat flows through the first heat exchanger, the first evaporator absorbs the heat transferred by the first heat exchanger, and the first evaporator, the compressor, the condenser and the expansion valve TXV1 form a cooling loop for cooling the battery pack. In addition, the second evaporator, the compressor, the condenser and the expansion valve TXV2 may form a cooling loop to cool a passenger compartment of the electric vehicle.

The following describes an implementation process of heating the battery pack using energy obtained by the motor from the charging device.

Under a condition that the battery pack needs to be heated, the BMS controls all of the charging positive electrode switch K1, the charging negative electrode switch K2, the switch K5 and the switch K6 to turn on, controls the heating switch K3 and the heating switch K4 to turn off, and controls the motor controller to provide the switch drive component J with a drive signal, to enable the power switch device of the target upper arm and the power switch device of the target lower arm to be turned on, so that the motor obtains energy from the charging device, and the stator inductors of the motor store the energy.

After the motor stores the energy, the BMS controls the charging positive electrode switch K1 and the charging negative electrode switch K2 to turn off, controls all of the switch K5, the switch K6, the heating switch K3 and the heating switch K4 to turn on, and controls the motor controller to provide the switch drive component J with a drive signal, to enable the power switch device of the target upper arm and the power switch device of the target lower arm to be turned off. Then the stator inductor corresponding to the power switch device of the target upper arm, the parasitic diode of the power switch device of the target upper arm, the switch K5, the heating switch K3, the battery pack, the heating switch K4, the switch K6, the parasitic diode of the power switch device of the target lower arm, and the stator inductor corresponding to the power switch device of the target lower arm constitute a charging loop of the battery pack, so that the energy stored in the motor heats the battery pack.

Figure 5:
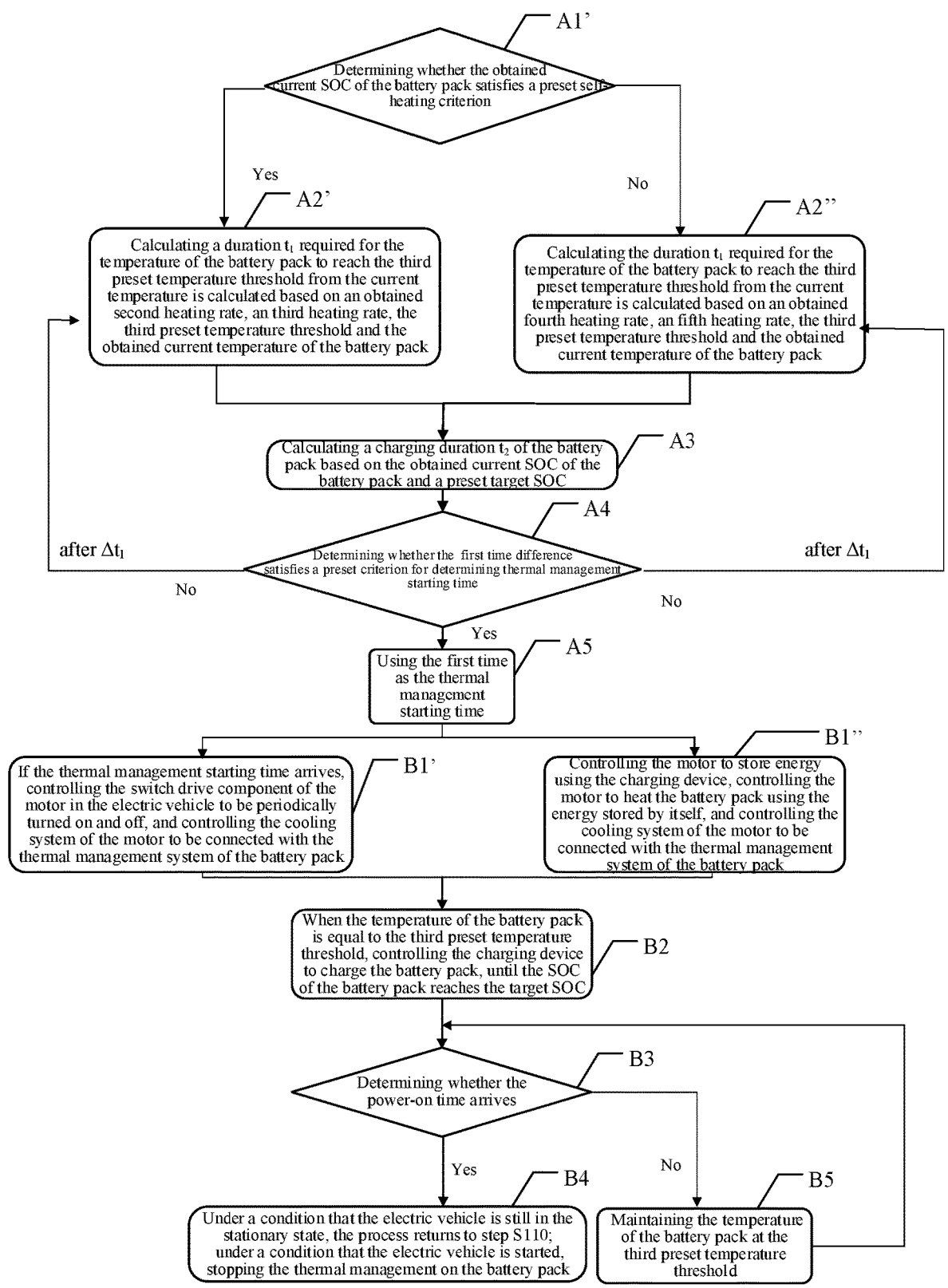
FIG. 5 is a schematic flowchart of a fourth embodiment of a thermal management method for a battery pack provided according to the present application.

When the BMS determines that the charging device does not have the heating function for the battery pack, the BMS needs to determine which heating method is used for performing the thermal management on the battery pack. Referring to FIG. 5, when the BMS determines that the charging device does not have the heating function for the battery pack, step S130 includes step A1' to step A5.

Step A1', whether the obtained current SOC of the battery pack satisfies a preset self-heating criterion is determined.

Under a condition that the current SOC of the battery pack satisfies the preset self-heating criterion, the process proceeds to step A2'. Under a condition that the current SOC of the battery pack does not satisfy the preset self-heating criterion, the process proceeds to step A2".

In the embodiments of the present application, the preset self-heating criterion is that the current SOC of the battery pack is greater than a preset SOC threshold.

Step A2', a duration $t_1$ required for the temperature of the battery pack to reach the third preset temperature threshold from the current temperature is calculated based on an obtained second heating rate, an obtained third heating rate, the third preset temperature threshold and the obtained current temperature of the battery pack.

In the embodiments of the present application, under a condition that the current SOC of the battery pack satisfies the preset self-heating criterion, the battery pack may be heated using the self-heating function of the battery pack. In addition, when the battery pack is self-heated, the motor generates heat, so the battery pack may also be heated using the waste heat of the motor. That is, when the self-heating function of the battery pack is started, the cooling system of the motor and the thermal management system of the battery pack may also be started, to heat the battery pack using the waste heat of the motor.

Therefore, in calculating $t_1$, a self-heating rate (second heating rate) of the battery pack and a heating rate (third heating rate) of the waste heat of the motor during the self-heating need to be obtained.

In the embodiments of the present application, the self-heating rate of the battery pack corresponding to the current state parameter of the battery pack may be obtained according to a pre-stored corresponding relationship between the state parameter of the battery pack and the self-heating rate of the battery pack. In addition, the heating rate of the waste heat of the motor corresponding to the current state parameter of the battery pack may also be obtained according to a pre-stored corresponding relationship between the state parameter of the battery pack and the heating rate of the waste heat of the motor.

In calculating $t_1$, a heat conduction factor between the battery pack and an external environment also needs to be considered. As such, the heating duration $t_1$ may be calculated using a method similar to equation (1) based on the self-heating rate of the battery pack, the heating rate of the waste heat of the motor, the heat conduction rate, the third preset temperature threshold and the current temperature of the battery pack, and the specific calculation process is not repeated herein.

Step A2", the duration $t_1$ required for the temperature of the battery pack to reach the third preset temperature threshold from the current temperature is calculated based on an obtained fourth heating rate, an obtained fifth heating rate, the third preset temperature threshold and the obtained current temperature of the battery pack.

In the embodiments of the present application, under a condition that the current SOC of the battery pack does not satisfy the self-heating criterion, it indicates that current remaining power of the battery pack is less and the self-heating of the battery pack is not supported, then the battery pack may be heated using the energy obtained by the motor from the charging device. During heating of the battery pack by the motor using the stored energy, the motor also generates waste heat, so the battery pack may also be heated using the waste heat of the motor.

Therefore, in calculating $t_1$, a heating rate (fourth heating rate) of heating the battery pack using the energy stored by the motor from the charging device and a heating rate (fifth heating rate) of the waste heat of the motor during the heating by the energy stored the motor need to be obtained.

In the embodiments of the present application, the fourth heating rate and the fifth heating rate may be pre-stored, and may also be queried according to a pre-stored corresponding relationship between the state parameter of the battery pack and the heating rate, which is not specifically limited herein.

In calculating $t_1$, a heat conduction factor between the battery pack and an external environment also needs to be considered. As such, the heating duration $t_1$ may be calculated using a method similar to equation (1) based on the fourth heating rate, the fifth heating rate, the heat conduction rate, the third preset temperature threshold and the current temperature of the battery pack, and the specific calculation process is not repeated herein.

Continuing to refer to FIG. 5, regardless of whether the current SOC of the battery pack satisfies the self-heating criterion of the battery, after the duration $t_1$ required for the temperature of the battery pack to reach the third preset temperature threshold from the current temperature is calculated, the process proceeds to step A3.

Step A3, the BMS obtains a current SOC of the battery pack, and calculates a charging duration $t_2$ of the battery pack based on the current SOC of the battery pack and a preset target SOC of the battery pack.

Step A4, the BMS obtains a current time, and determines whether a first time difference between a first time and the current time satisfies a preset criterion for determining thermal management starting time.

Under a condition that the first time difference satisfies the preset criterion for determining thermal management starting time, the process proceeds to step A5.

Under a condition that the current SOC of the battery pack satisfies the preset self-heating criterion, if the first time difference does not satisfy the preset criterion for determining thermal management starting time, the process returns to step A2' after the second preset time interval $\Delta t_1$.

It should be noted that after the process returns to step A2', only the current temperature of the battery pack needs to be re-obtained, and the remaining parameters may not need to be re-obtained. Then $t_1$ and $t_2$ are updated using the updated current temperature of the battery pack, until the thermal management starting time of the battery pack is obtained.

Under a condition that the current SOC of the battery pack does not satisfy the preset self-heating criterion, if the first time difference does not satisfy the preset criterion for determining thermal management starting time the process returns to step A2″ after the second preset time interval $\Delta t_1$.

It should be noted that after the process returns to step A2″, only the current temperature of the battery pack needs to be re-obtained, and the remaining parameters may not need to be re-obtained. Then $t_1$ and $t_2$ are updated using the updated current temperature of the battery pack, until the thermal management starting time of the battery pack is obtained.

Step A5, the first time is used as the thermal management starting time.

Under a condition that the current SOC of the battery pack satisfies the preset self-heating criterion, step S140 includes step B1' and step B2 to step B5.

Under a condition that the current SOC of the battery pack does not satisfy the preset self-heating criterion, step S140 includes step B1″ and step B2 to step B5.

Step B1', the BMS controls the switch drive component of the motor in the electric vehicle to be periodically turned on and off so as to heat the battery pack, and controls the cooling system of the motor to be connected with the thermal management system of the battery pack so as to heat the battery pack using waste heat generated by the motor.

Specifically, under a condition that the thermal management starting time arrives, the BMS controls all of the heating switch K3, the heating switch K4, the switch K5 and the switch K6 to turn on, and controls the motor controller to provide the switch drive component J with a drive signal, to control the switch drive component J of the motor in the electric vehicle to be periodically turned on and off so as to heat the battery pack.

While controlling all of the heating switch K3, the heating switch K4, the switch K5 and the switch K6 to turn on, the BMS controls all of the water pump 1, the water pump 2 and the second heat exchanger to be in an on-state, to connect the cooling system of the motor with the thermal management system of the battery pack so as to heat the battery pack using waste heat generated by the motor during the self-heating.

Step B1″, the BMS controls the motor to store energy using the charging device, controls the motor to heat the battery pack using the energy stored by itself, and controls the cooling system of the motor to be connected with the thermal management system of the battery pack to heat the battery pack using waste heat generated by the motor.

Specifically, the BMS firstly controls all of the charging positive electrode switch K1, the charging negative electrode switch K2, the switch K5 and the switch K6 to turn on, controls the heating switch K3 and the heating switch K4 to turn off, and controls the motor controller to provide the switch drive component J with a drive signal, to enable the power switch device of the target upper arm and the power switch device of the target lower arm to be turned on, so that the motor obtains energy from the charging device, and the stator inductors of the motor store the energy. Meanwhile, the BMS controls all of the water pump 1, the water pump 2 and the second heat exchanger to be in an on-state to connect the cooling system of the motor with the thermal management system of the battery pack so as to heat the battery pack using waste heat generated by the motor during heating of the battery pack using the energy stored by the motor.

After the motor stores the energy, the BMS controls the charging positive electrode switch K1 and the charging negative electrode switch K2 to turn off, controls all of the switch K5, the switch K6, the heating switch K3 and the heating switch K4 to turn on, and controls the motor controller to provide the switch drive component J with a drive signal, to enable the power switch device of the target upper arm and the power switch device of the target lower arm to be turned off, so that the energy stored by the motor heats the battery pack.

Step B2, when the temperature of the battery pack is equal to the third preset temperature threshold, the charging device is controlled to charge the battery pack, until the SOC of the battery pack reaches the target SOC.

Step B3, when the power of the battery pack reaches a preset target power, it is determined whether the power-on time arrives. Under a condition that the power-on time arrives, the process proceeds to step B4, and under a condition that the power-on time does not arrive, the process proceeds to step B5.

Step B4, under a condition that the electric vehicle is still in the stationary state, the process returns to step S110; and under a condition that the electric vehicle is started, the thermal management on the battery pack is stopped.

In the embodiments of the present application, when the battery pack is heated using the self-heating function of the battery, under a condition that the power-on time arrives and the electric vehicle is still in the stationary state, it indicates that the user does not travel according to the set time, then the BMS controls all of the heating switch K3, the heating switch K4, the switch K5 and the switch K6 to turn off, and re-obtains the power-on time of the battery pack, that is, the process returns to step S110.

When the battery pack is heated using the energy obtained by the motor from the charging device, under a condition that the power-on time arrives and the electric vehicle is still in the stationary state, the BMS controls all of the charging positive electrode switch K1, the charging negative electrode switch K2, the switch K5 and the switch K6 to turn off, and re-obtains the power-on time of the battery pack, that is, the process returns to step S110.

Under a condition that the electric vehicle is started, the BMS controls all the switches to turn off to stop performing the thermal management on the battery pack.

Step B5, the temperature of the battery pack is maintained at the third preset temperature threshold.

In order that the thermal management method for the battery pack provided in the embodiments of the present application is suitable for more thermal management application scenarios, in the embodiment of the present application, under a condition that the power-on time does not arrive, the BMS monitors the temperature of the battery pack in real time. Under a condition that a temperature difference between the temperature of the battery pack and the third preset temperature threshold satisfies a preset thermal management starting criterion, the thermal management on the battery pack is resumed, to maintain the temperature of the battery pack at the third preset temperature threshold. After the temperature of the battery pack reaches the third preset temperature threshold, the process returns to step B3, until the power-on time arrives under the third preset temperature threshold.

In some other embodiments of the present application, the temperature of the battery pack may change during the charging of the battery pack by the charging device. Therefore, during the charging of the battery pack, the temperature of the battery pack may also be obtained in real time, and under a condition that the temperature difference between the temperature of the battery pack and the target temperature satisfies the preset thermal management starting criterion, the charging device is controlled to stop charging the battery pack.

After the charging device stops charging the battery pack, the BMS determines whether the power of the battery pack reaches the preset target power.

Under a condition that the power of the battery pack reaches the preset target power, step B3 is performed so that the battery pack reaches the preset target SOC under the target temperature. Under a condition that the SOC of the battery pack does not reach the preset target SOC, the thermal management on the battery pack is resumed to heat the battery pack to the target temperature, until the SOC of the battery pack reaches the target SOC under the target temperature.

That is, under a condition that the temperature of the battery pack decreases during the heating of the battery pack by the charging device, the charging of the battery pack is stopped, and the battery pack is re-heated so as to charge the battery pack under the target temperature.

In some embodiments, in order to adapt to the above-mentioned thermal management scenario with charging and thermal management intervals, and to ensure that the thermal management of the battery pack and the charging of the battery pack are completed before the power-on time arrives, in steps A2, A2' and A2", a preset margin duration $t_s$ may be added in calculating the duration required for the temperature of the battery pack to reach the target temperature from the current temperature. Herein, the $t_s$ may be determined based on an empirical value.

As a specific example, in step A2, $t_1$ may be calculated using the following equation:

$$t_1 = \frac{Temp3 - T_0}{v_1 \times \gamma_1} + \frac{Temp3 - T\_env}{v_2 \times \gamma_2} + t_s \quad (2)$$

Scenario 2: the battery pack has the demand for cooling, and the charging interface of the electric vehicle is connected with the charging device.

In scenario 2, since the charging interface of the electric vehicle is connected with the charging device, the target temperature of the battery pack may also be set as the third preset temperature threshold.

Figure 6:
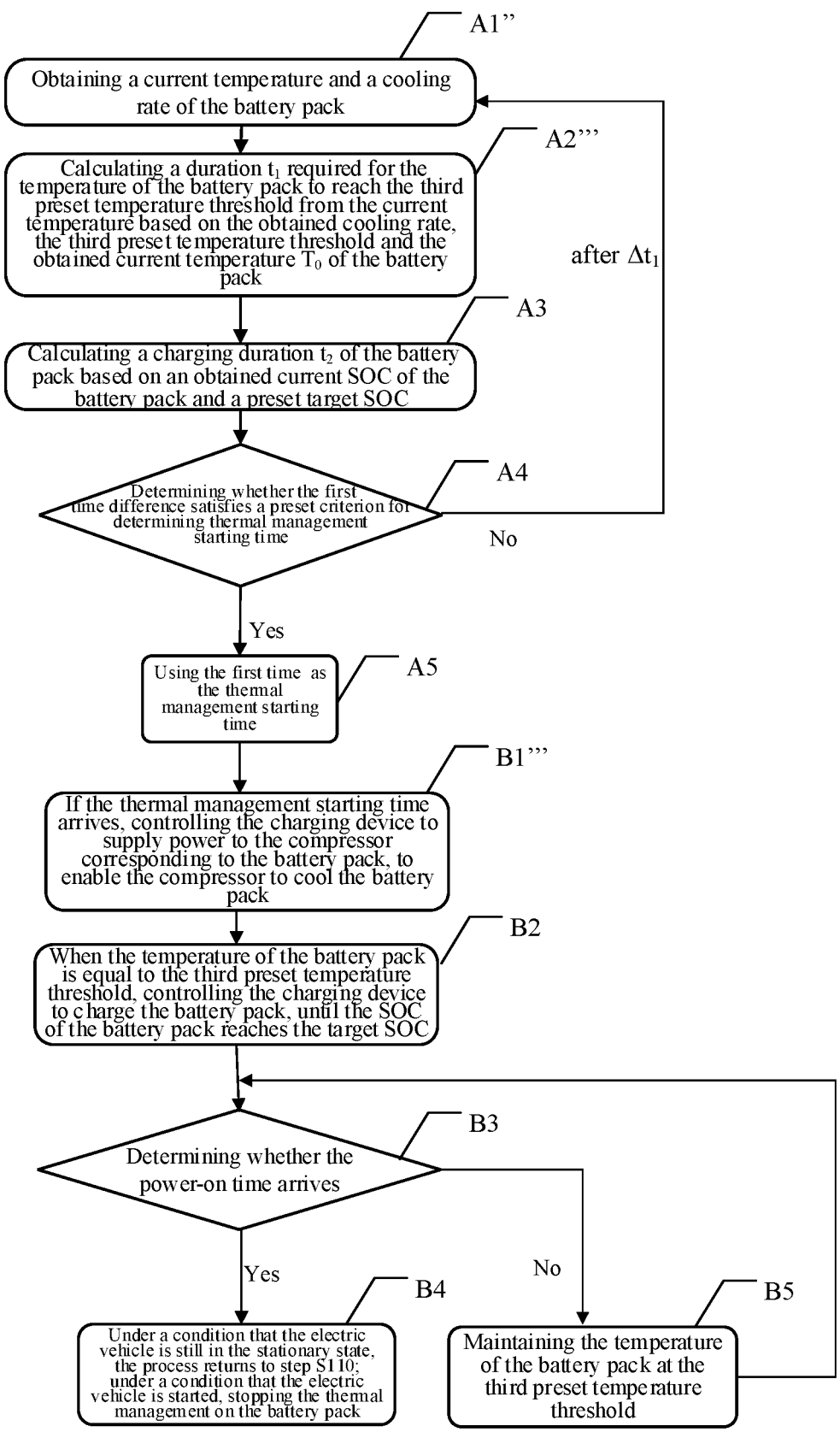
FIG. 6 is a schematic flowchart of a fifth embodiment of a thermal management method for a battery pack provided according to the present application.

In scenario 2, referring to FIG. 6, the thermal management strategy is similar to that when the battery pack has the demand for heating and the charging interface of the electric vehicle is connected with the charging device, except that a cooling rate is used in calculating the duration $t_1$ required for the temperature of the battery pack to reach the third preset temperature threshold from the current temperature.

In scenario 2, step S130 includes step A1" to step A5.

Step A1", the BMS obtains a current temperature and a cooling rate of the battery pack.

Herein, the cooling rate of the battery pack by the air-conditioning system may be a preset cooling rate, and may also be obtained according to a corresponding relationship between the state parameter of the battery pack and the cooling rate, which is not limited herein.

Step A2''', the BMS calculates a duration $t_1$ required for the temperature of the battery pack to reach the third preset temperature threshold from the current temperature based on the obtained cooling rate, the third preset temperature threshold and the obtained current temperature $T_0$ of the battery pack.

The specific calculation method may use an idea similar to that of equation (1), which is not repeated herein.

Step A3, the BMS calculates a charging duration $t_2$ of the battery pack based on an obtained current SOC of the battery pack and a preset target SOC.

Step A4, the BMS obtains a current time, and determines whether a first time difference between a first time and the current time satisfies a preset criterion for determining thermal management starting time.

Herein, the first time is before the power-on time of the battery pack, and a duration between the first time and the power-on time is equal to $t_1+t_2$.

Under a condition that the first time difference satisfies the preset criterion for determining thermal management starting time, the process proceeds to step A5.

Step A5, the first time is used as the thermal management starting time.

Under a condition that the first time difference does not satisfy the preset criterion for determining thermal management starting time, the process returns to step A1" after the second preset time interval $\Delta t_1$, that is, the temperature of the battery pack is updated, and $t_1$ and $t_2$ are updated based on the re-obtained current temperature of the battery pack, until the thermal management starting time of the battery pack is obtained.

In scenario 2, step S140 includes step B1''' to step B5.

Step B1''', under a condition that the thermal management starting time arrives, the charging device is controlled to supply power to the compressor corresponding to the battery pack, to enable the compressor to cool the battery pack.

When the BMS determines that the thermal management starting time arrives, the BMS controls the switch K7 and the switch K8 to turn on, converts a voltage output by the charging device into a voltage for stable operation of the compressor through a voltage converter, and controls all of the expansion valve TXV1 and the expansion valve TXV2 to open. After the compressor and the water pump 1 are started, the air-conditioning system may cool the battery pack.

Step B2, when the temperature of the battery pack is equal to the third preset temperature threshold, the charging device is controlled to charge the battery pack, until the SOC of the battery pack reaches the target SOC.

During the cooling of the battery pack, the BMS monitors the temperature of the battery pack in real time. When the temperature of the battery pack is equal to the third preset temperature threshold, the BMS controls the switch K7 and the switch K8 to turn off to stop cooling the battery pack. In addition, the BMS controls all of the charging positive electrode switch K1, the charging negative electrode switch K2, the heating switch K3 and the heating switch K4 to turn on, sends a charging request including a charging current to the charging device, and controls the charging device to charge the battery pack with this charging current, until the SOC of the battery pack reaches the preset target SOC.

Step B3, when the power of the battery pack reaches the preset target power, it is determined whether the power-on time arrives. Under a condition that the power-on time arrives, the process proceeds to step B4, and under a condition that the power-on time does not arrive, the process proceeds to step B5.

Step B4, under a condition that the electric vehicle is still in the stationary state, the process returns to step S110; and under a condition that the electric vehicle is started, the thermal management on the battery pack is stopped.

Under a condition that the power-on time arrives and the electric vehicle is still in the stationary state, it indicates that the user does not travel according to the set time, then the BMS controls all of the switches K1 to K8 to turn off, and re-obtains the power-on time of the battery pack, that is, the process returns to step S110. Under a condition that the power-on time arrives and the electric vehicle is started, it indicates that the user travels on time, then the BMS controls all of the switches K1 to K8 to turn off to stop performing the thermal management on the battery pack.

Step B5, the temperature of the battery pack is maintained at the third preset temperature threshold.

In order that the thermal management method for the battery pack provided in the embodiments of the present application is suitable for more thermal management application scenarios, under a condition that the power-on time does not arrive, the BMS monitors the temperature of the battery pack in real time. Under a condition that a temperature difference between the temperature of the battery pack and the third preset temperature threshold satisfies a preset thermal management starting criterion, the BMS controls the switch K7 and the switch K8 to turn on, and controls the expansion valve TXV1 and the expansion valve TXV2 to open so as to re-cool the battery pack. Under a condition that the temperature of the battery pack reaches the target temperature, the BMS controls the switch K7 and the switch K8 to turn off, to stop performing the thermal management on the battery pack so as to maintain the temperature of the battery pack at the target temperature. After the temperature of the battery pack reaches the third preset temperature threshold, the process returns to step B3, until the power-on time arrives under the third preset temperature threshold. Herein, in the demand for cooling, the preset thermal management starting criterion is that a difference of the temperature of the battery pack minus the third preset temperature threshold is greater than a preset temperature difference threshold.

Scenario 3: the battery pack has the demand for heating, and the charging interface of the electric vehicle is not connected with the charging device.

In scenario 3, since the electric vehicle is not connected with the charging pile, the battery pack may only be heated by the self-heating function of the battery pack and waste heat generated by the motor during the self-heating. Since the battery pack cannot be heated with an external charging device, the target temperature of the battery pack is set as the fourth preset temperature threshold. As an example, the fourth preset temperature threshold is the lowest operating temperature Temp1 of the battery pack.

In scenario 3, since the battery pack needs to be self-heated consuming its own power and there is no charging device for charging, the BMS needs to control the vehicle controller to send the current remaining SOC and the SOC required for thermal management to the intelligent terminal, and sends prompt information about whether the thermal management is performed using the remaining SOC of the battery pack.

Under a condition that the user does not choose to perform the thermal management on the battery pack, the BMS does not operate, and under a condition that the user chooses to perform the thermal management on the battery pack, the BMS receives a heating instruction of the user from the vehicle controller.

Figure 7:
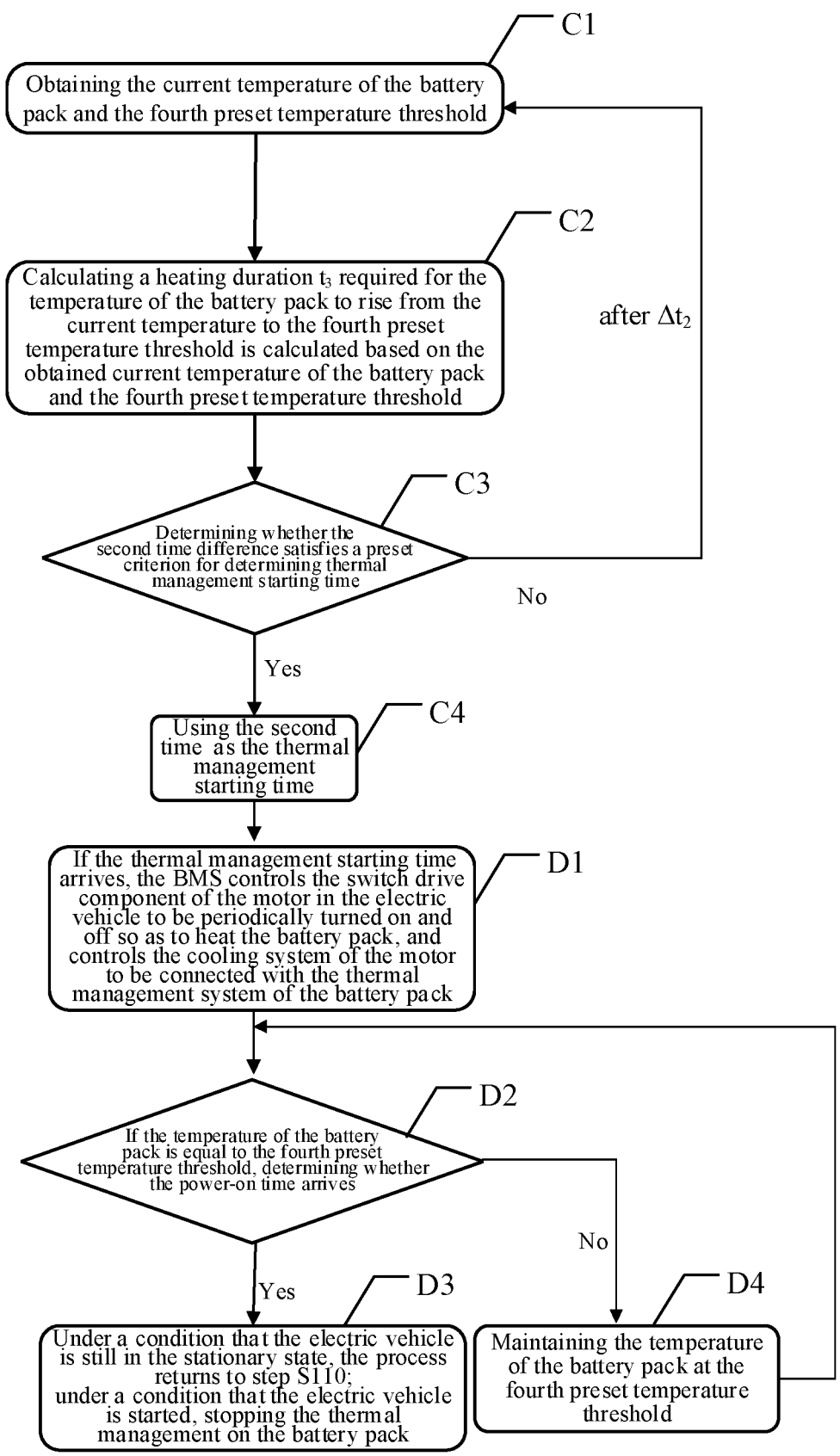
FIG. 7 is a schematic flowchart of a sixth embodiment of a thermal management method for a battery pack provided according to the present application.

Referring to FIG. 7, in scenario 3, step S130 includes step C1 to step C4.

Step C1, a heating instruction is received from a user, and a current temperature of the battery pack and the fourth preset temperature threshold are obtained.

Step C2, a heating duration $t_3$ required for the temperature of the battery pack to rise from the current temperature to the fourth preset temperature threshold is calculated based on the obtained current temperature of the battery pack and the fourth preset temperature threshold.

Specifically, the BMS may obtain a self-heating rate of the battery pack, a heating rate of waste heat of the motor during the self-heating, a fourth preset temperature threshold and a current temperature of the battery pack, and calculate the heating duration $t_3$. The specific calculation method may use an idea similar to that of equation (1), which will not be repeated herein.

Step C3, whether a second time difference between a second time and an obtained current time satisfies a preset criterion for determining thermal management starting time is determined.

Under a condition that the second time difference satisfies the preset criterion for determining thermal management starting time, the process proceeds to step C4. Herein, the second time is also an estimated thermal management starting time.

Step C4, the second time is used as the thermal management starting time.

Herein, the second time is before the power-on time, and a duration between the second time and the power-on time is equal to $t_3$.

Under a condition that the second time difference does not satisfy the preset criterion for determining thermal management starting time, the process returns to step C1 after a third preset time interval $\Delta t_2$.

That is, under a condition that the second time difference does not satisfy the preset criterion for determining thermal management starting time, after the preset time interval $\Delta t_2$, the current temperature of the battery pack is updated, and $t_3$ is updated based on the re-obtained current temperature of the battery pack, until the thermal management starting time of the battery pack is obtained.

In scenario 3, step S140 includes step D1 to step D4.

Step D1, under a condition that the thermal management starting time arrives, the BMS controls the switch drive component of the motor in the electric vehicle to be periodically turned on and off so as to heat the battery pack, and controls the cooling system of the motor to be connected with the thermal management system of the battery pack so as to heat the battery pack using waste heat generated by the motor.

In scenario 3, the thermal management strategy of the battery pack by the BMS is similar to the thermal management strategy in scenario 1 where the current SOC of the battery pack satisfies the preset self-heating criterion, which will not repeated herein.

Step D2, under a condition that the temperature of the battery pack is equal to the fourth preset temperature threshold, it is determined whether the power-on time arrives. Under a condition that the power-on time arrives, the process proceeds to step D3, and under a condition that the power-on time does not arrive, the process proceeds to step D4.

In the embodiments of the present application, the BMS obtains the temperature of the battery pack in real time, and determines whether the temperature of the battery pack reaches the fourth preset temperature threshold. Under a condition that the temperature of the battery pack is equal to the fourth preset temperature threshold, it is determined whether the power-on time arrives.

Step D3, under a condition that the electric vehicle is still in the stationary state, the process returns to step S110.

Under a condition that the electric vehicle is started, the thermal management on the battery pack is stopped.

Step D4, the temperature of the battery pack is maintained at the fourth preset temperature threshold.

In order that the thermal management method for the battery pack provided in the embodiments of the present application is suitable for more thermal management application scenarios, under a condition that the power-on time does not arrive, the BMS monitors the temperature of the battery pack in real time. Under a condition that a temperature difference between the temperature of the battery pack and the fourth preset temperature threshold satisfies the preset thermal management starting criterion, the thermal management on the battery pack is resumed, to maintain the temperature of the battery pack at the fourth preset temperature threshold. After the temperature of the battery pack reaches the fourth preset temperature threshold, the process returns to step D2, until the power-on time arrives under the fourth preset temperature threshold.

Scenario 4: the battery pack has the demand for cooling, and the charging interface of the electric vehicle is not connected with the charging device.

In scenario 4, the target temperature of the battery pack is the fifth preset temperature threshold. The BMS needs to control the vehicle controller to send prompt information about whether to perform thermal management to the intelligent terminal. Under a condition that the user does not choose to perform the thermal management on the battery pack, the BMS does not operate. Under a condition that the user chooses to perform the thermal management on the battery pack, the BMS receives a cooling instruction of the user from the vehicle controller.

Figure 8:
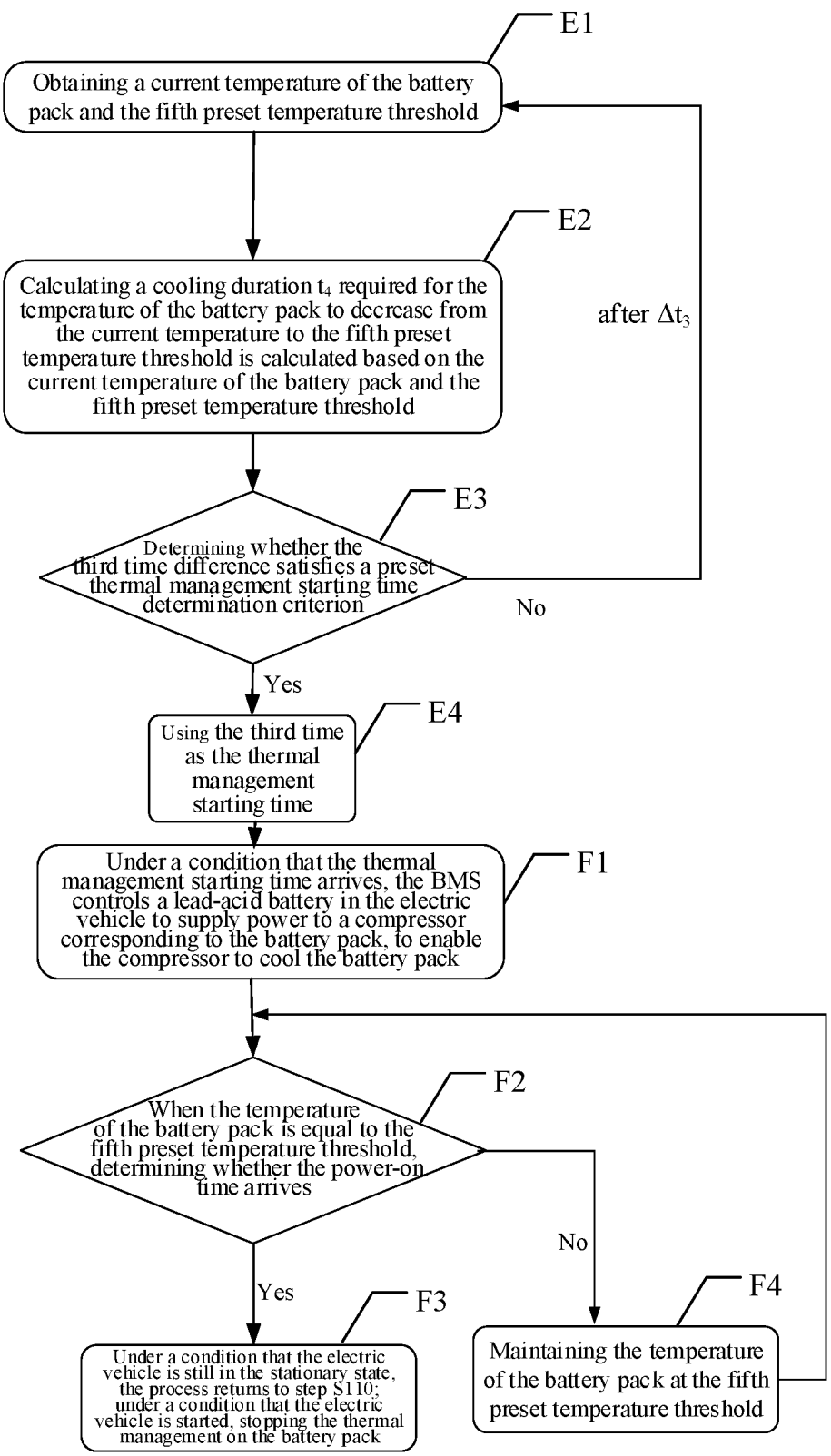
FIG. 8 is a schematic flowchart of a seventh embodiment of a thermal management method for a battery pack provided according to the present application.

In scenario 4, referring to FIG. 8, step S130 includes step E1 to step E4.

Step E1, the BMS receives a cooling instruction from a user, and obtains a current temperature of the battery pack and the fifth preset temperature threshold.

Step E2, a cooling duration $t_4$ required for the temperature of the battery pack to decrease from the current temperature to the fifth preset temperature threshold is calculated based on the current temperature of the battery pack and the fifth preset temperature threshold.

Herein, the cooling rate of the battery pack by the air-conditioning system may be a preset cooling rate. Specifically, the BMS may calculate the cooling duration $t_4$ based on an obtained cooling rate of the battery pack, the fifth preset temperature threshold and the current temperature of the battery pack. The specific calculation method may use an idea to similar to that of equation (1), which will not be repeated herein.

Step E3, whether a third time difference between a third time and an obtained current time satisfies a preset criterion for determining thermal management starting time is determined.

Herein, the third time is before the power-on time, and a duration between the third time and the power-on time is equal to $t_4$. Herein, the third time is also an estimated thermal management starting time.

Under a condition that the third time difference satisfies the preset criterion for determining thermal management starting time, the process proceeds to step E4.

Step E4, the third time is used as the thermal management starting time.

Under a condition that the third time difference does not satisfy the preset criterion for determining thermal management starting time, the process returns to step E1 after a fourth preset time interval $\Delta t_3$.

That is, under a condition that the third time difference does not satisfy the preset criterion for determining thermal management starting time, after the preset time interval $\Delta t_3$, the current temperature of the battery pack is updated, and $t_4$ is updated based on the re-obtained current temperature of the battery pack, until the thermal management starting time of the battery pack is obtained.

In scenario 4, step S140 includes step F1 to step F4:

Step F1, under a condition that the thermal management starting time arrives, the BMS controls a lead-acid battery in the electric vehicle to supply power to a compressor corresponding to the battery pack, to enable the compressor to cool the battery pack.

After both the compressor and the water pump 1 are started, the air-conditioning system may cool the battery pack. During the cooling of the battery pack, the BMS monitors the temperature of the battery pack in real time, and determines whether the temperature of the battery pack reaches the fifth preset temperature threshold.

Step F2, when the temperature of the battery pack is equal to the fifth preset temperature threshold, it is determined whether the power-on time arrives. Under a condition that the power-on time arrives, the process proceeds to step F3, and under a condition that the power-on time does not arrive, the process proceeds to step F4.

In the embodiments of the present application, the BMS obtains the temperature of the battery pack in real time, and determines whether the temperature of the battery pack reaches the fifth preset temperature threshold. Under a condition that the temperature of the battery pack is equal to the fifth preset temperature threshold, it is determined whether the power-on time arrives.

Step F3, under a condition that the electric vehicle is still in the stationary state, the process returns to step S110. Under a condition that the electric vehicle is started, the thermal management on the battery pack is stopped.

In the embodiments of the present application, under a condition that the temperature of the battery pack is equal to the fifth preset temperature threshold, if the power-on time arrives, it is determined whether the electric vehicle is in the stationary state. Under a condition that the electric vehicle is still in the stationary state, the process returns to step S110. Under a condition that the electric vehicle is started, the thermal management on the battery pack is stopped.

Step F4, the temperature of the battery pack is maintained at the fifth preset temperature threshold.

In order that the thermal management method for the battery pack provided in the embodiments of the present application is suitable for more thermal management application scenarios, under a condition that the power-on time does not arrive, the BMS monitors the temperature of the battery pack in real time. Under a condition that a temperature difference between the temperature of the battery pack and the fifth preset temperature threshold satisfies the preset thermal management starting criterion, the thermal management on the battery pack is resumed, to maintain the temperature of the battery pack at the fifth preset temperature threshold. After the temperature of the battery pack reaches the fifth preset temperature threshold, the process returns to step F2, until the power-on time arrives under the fifth preset temperature threshold.

In the embodiments of the present application, different target temperatures are set for the battery pack under different application scenarios, to avoid power consumption of the battery pack as much as possible. In addition, the thermal management starting time of the battery pack is determined by combining the power-on time of the battery pack with the target temperature, and the thermal management is intelligently performed on the battery pack on the basis of increasing the driving mileage of the electric vehicle, the user experience is improved.

In the embodiments of the present application, with the communications between the vehicle controller and the intelligent terminal, the thermal management may be performed intelligently on the battery pack with full consideration of user demands.

It should also be noted that the exemplary embodiments mentioned in the present application describe some methods or systems based on a series of steps or devices. However, the present application is not limited to the above order of steps, that is, the steps may be executed in the order mentioned in the embodiments, or in a different order than those in the embodiments, or several steps may be executed at the same time.

The above are merely specific implementations of the present application, and those skilled in the art can explicitly understand that, for convenience and conciseness of the descriptions, the specific working processes of the above systems, modules and units may refer to the corresponding processes in the forgoing method embodiments, which will not be repeated herein. It should be understood that the scope of the present application is not limited thereto, and those skilled person in the art can readily conceive various equivalent modifications or replacements within the technical scope disclosed by the present application, and all of these modifications or replacements shall be within the scope of the present application.

What is claimed is:

1. A thermal management method for a battery pack, comprising:
   under a condition that an electric vehicle is in a stationary state, obtaining a power-on time of the battery pack in the electric vehicle;
   under a condition of determining that the battery pack has a thermal management demand, determining a target temperature of the battery pack according to a connection state of a charging interface of the electric vehicle and a charging device;
   determining a thermal management starting time of the battery pack based on the target temperature of the battery pack and the power-on time; and
   under a condition that the thermal management starting time arrives, performing thermal management on the battery pack so that a temperature of the battery pack reaches the target temperature before the power-on time arrives;
   wherein the under a condition of determining that the battery pack has a thermal management demand, determining a target temperature of the battery pack according to a connection state of a charging interface of the electric vehicle and a charging device comprises:
   under a condition that the battery pack has the thermal management demand and the charging interface is connected with the charging device, setting the target temperature as a third preset temperature threshold;
   under a condition that the thermal management demand of the battery pack is a demand for heating and the charging interface is not connected with the charging device, setting the target temperature as a fourth preset temperature threshold;
   under a condition that the thermal management demand of the battery pack is a demand for cooling and the charging interface is not connected with the charging device, setting the target temperature as a fifth preset temperature threshold; and
   wherein the fourth preset temperature threshold is less than the third preset temperature threshold, and the third preset temperature threshold is less than the fifth preset temperature threshold.

2. The method according to claim 1, wherein the determining that the battery pack has a thermal management demand comprises:
   under a condition that an obtained temperature of the battery pack is less than a first preset temperature threshold, determining that the thermal management demand of the battery pack is a demand for heating;
   under a condition that the temperature of the battery pack is greater than a second preset temperature threshold, determining that the thermal management demand of the battery pack is a demand for cooling; and
   wherein the first preset temperature threshold is determined based on a lowest operating temperature of the battery pack, and the second preset temperature threshold is determined based on a highest operating temperature of the battery pack.

3. The method according to claim 1, wherein under a condition that the battery pack has the thermal management demand and the charging interface is connected with the charging device, the method further comprises:
   under a condition that the temperature of the battery pack reaches the target temperature, stopping performing the thermal management on the battery pack, and controlling the charging device to charge the battery pack;
   during charging of the battery pack, obtaining the temperature of the battery pack in real time, and under a condition that a temperature difference between the temperature of the battery pack and the target temperature satisfies a preset thermal management starting criterion, controlling the charging device to stop charging the battery pack;
   resuming the thermal management on the battery pack so that the temperature of the battery pack reaches the target temperature; and
   after resuming the thermal management on the battery pack so that the temperature of the battery pack reaches the target temperature, under a condition that a state of charge (SOC) of the battery pack does not reach a preset target SOC, controlling the charging device to charge the battery pack;
   repeating the thermal management and the charging, until the SOC of the battery pack reaches the target SOC at the target temperature.

4. The method according to claim 3, further comprising:
   under a condition that the electric vehicle is in the stationary state when the power on time arrives, re-obtaining the power-on time of the battery pack.

5. The method according to claim 1, further comprising:
   under a condition that the electric vehicle is in the stationary state when the power on time arrives, re-obtaining the power-on time of the battery pack.

6. The method according to claim 1, wherein under a condition that the battery pack has the thermal management demand and the charging interface is connected with the charging device, the determining a thermal management starting time of the battery pack based on the target temperature of the battery pack and the power-on time comprises:
   calculating, based on an obtained current temperature of the battery pack and the third preset temperature threshold, a duration $t_1$ required for the temperature of the battery pack to reach the third preset temperature threshold from the current temperature;

calculating a charging duration $t_2$ of the battery pack based on an obtained current SOC of the battery pack and a preset target SOC;

under a condition that a first time difference between a first time and an obtained current time satisfies a preset criterion for determining thermal management starting time, using the first time as the thermal management starting time, wherein the first time is before the power-on time, and a duration between the first time and the power-on time is equal to $t_1+t_2$; and under a condition that the first time difference does not satisfy the preset criterion for determining thermal management starting time, updating the current temperature of the battery pack after a first preset time interval, until the thermal management starting time of the battery pack is obtained.

7. The method according to claim 6, wherein under a condition that the thermal management demand of the battery pack is the demand for heating, the calculating, based on an obtained current temperature of the battery pack and the third preset temperature threshold, a duration $t_1$ required for the temperature of the battery pack to reach the third preset temperature threshold from the current temperature comprises:

determining, based on received heating identification information of the charging device, whether the charging device has a heating function; and under a condition that the charging device has the heating function, calculating the duration $t_1$ required for the temperature of the battery pack to reach the third preset temperature threshold from the current temperature based on an obtained first heating rate, the third preset temperature threshold and the obtained current temperature of the battery pack.

8. The method according to claim 7, wherein the under a condition that the thermal management starting time arrives, performing the thermal management on the battery pack comprises:

under a condition that the thermal management starting time arrives, sending a heating parameter corresponding to the first heating rate to the charging device to enable the charging device to heat the battery pack according to the heating parameter.

9. The method according to claim 7, further comprising:

under a condition that the charging device does not have the heating function, determining whether the obtained current SOC of the battery pack satisfies a preset self-heating criterion; and under a condition that the current SOC of the battery pack satisfies the self-heating criterion, calculating the duration $t_1$ required for the temperature of the battery pack to reach the third preset temperature threshold from the current temperature based on an obtained second heating rate, an obtained third heating rate, the third preset temperature threshold and the obtained current temperature of the battery pack.

10. The method according to claim 9, wherein the under a condition that the thermal management starting time arrives, performing the thermal management on the battery pack comprises:

under a condition that the thermal management starting time arrives, controlling a switch drive component of a motor in the electric vehicle to be periodically turned on and off so as to heat the battery pack, and controlling a cooling system of the motor to be connected with a thermal management system of the battery pack so as to heat the battery pack using heat generated by the motor.

11. The method according to claim 9, further comprising:

under a condition that the current SOC of the battery pack does not satisfy the self-heating criterion, calculating the duration $t_1$ required for the temperature of the battery pack to reach the third preset temperature threshold from the current temperature based on an obtained fourth heating rate, an obtained fifth heating rate, the third preset temperature threshold and the obtained current temperature of the battery pack.

12. The method according to claim 11, wherein the under a condition that the thermal management starting time arrives, performing the thermal management on the battery pack comprises:

under a condition that the thermal management starting time arrives, controlling a motor to store energy using the charging device, controlling the motor to heat the battery pack using the energy stored by itself, and controlling a cooling system of the motor to be connected with a thermal management system of the battery pack to heat the battery pack using heat generated by the motor.

13. The method according to claim 1, wherein under a condition that the thermal management demand of the battery pack is a demand for cooling and the charging interface is connected with the charging device, the under a condition that the thermal management starting time arrives, performing the thermal management on the battery pack comprises:

under a condition that the thermal management starting time arrives, controlling the charging device to supply power to a compressor corresponding to the battery pack to enable the compressor to cool the battery pack.

14. The method according to claim 1, wherein under a condition that the thermal management demand of the battery pack is a demand for heating and the charging interface is not connected with the charging device, the determining a thermal management starting time of the battery pack based on the target temperature of the battery pack and the power-on time comprises:

receiving a heating instruction from a user, and calculating, based on the obtained current temperature of the battery pack and the fourth preset temperature threshold, a heating duration $t_3$ required for the temperature of the battery pack to rise from the current temperature to the fourth preset temperature threshold;

under a condition that a second time difference between a second time and an obtained current time satisfies a preset criterion for determining thermal management starting time, using the second time as the thermal management starting time, wherein the second time is before the power-on time, and a duration between the second time and the power-on time is equal to $t_3$; and under a condition that the second time difference does not satisfy the preset criterion for determining thermal management starting time, updating the current temperature of the battery pack after a second preset time interval, until the thermal management starting time of the battery pack is obtained.

15. The method according to claim 14, wherein the under a condition that the thermal management starting time arrives, performing the thermal management on the battery pack comprises:

under a condition that the thermal management starting time arrives, controlling a switch drive component of a motor in the electric vehicle to be periodically turned on and off so as to heat the battery pack, and controlling a cooling system of the motor to be connected with a thermal management system of the battery pack so as to heat the battery pack using heat generated by the motor.

16. The method according to claim 1, wherein under a condition that the thermal management demand of the battery pack is a demand for cooling and the charging interface is not connected with the charging device, the determining a thermal management starting time of the battery pack based on the target temperature of the battery pack and the power-on time comprises:

receiving a cooling instruction from a user, and calculating, based on the obtained current temperature of the battery pack and the fifth preset temperature threshold, a cooling duration $t_4$ required for the temperature of the battery pack to decrease from the current temperature to the fifth preset temperature threshold;

under a condition that a third time difference between a third time and an obtained current time satisfies a preset criterion for determining thermal management starting time, using the third time as the thermal management starting time, wherein the third time is before the power-on time, and a duration between the third time and the power-on time is equal to $t_4$; and under a condition that the third time difference does not satisfy the preset criterion for determining thermal management starting time, updating the current temperature of the battery pack after a third preset time interval, until the thermal management starting time of the battery pack is obtained.

17. The method according to claim 16, wherein the under a condition that the thermal management starting time arrives, performing the thermal management on the battery pack comprises:

under a condition that the thermal management starting time arrives, controlling a lead-acid battery in the electric vehicle to supply power to a compressor corresponding to the battery pack to enable the compressor to cool the battery pack.

18. The method according to claim 1, wherein the power-on time of the battery pack is a starting time of the electric vehicle, and is determined according to pre-recorded travel habit information of a user.

* * * * *